(12) United States Patent
Hack

(10) Patent No.: US 11,785,804 B2
(45) Date of Patent: *Oct. 10, 2023

(54) ONE WAY TRANSPARENT DISPLAY

(71) Applicant: Universal Display Corporation, Ewing, NJ (US)

(72) Inventor: Michael Hack, Carmel, CA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/987,910

(22) Filed: Nov. 16, 2022

(65) Prior Publication Data

US 2023/0072562 A1 Mar. 9, 2023

Related U.S. Application Data

(60) Continuation of application No. 17/183,582, filed on Feb. 24, 2021, now Pat. No. 11,532,683, which is a division of application No. 16/382,281, filed on Apr. 12, 2019, now Pat. No. 10,964,766, which is a division of application No. 15/170,986, filed on Jun.
(Continued)

(51) Int. Cl.
| | | |
|---|---|---|
| *H01L 21/00* | (2006.01) | |
| *H10K 59/121* | (2023.01) | |
| *H10K 59/38* | (2023.01) | |
| *H10K 59/88* | (2023.01) | |
| *H10K 59/128* | (2023.01) | |
| *H10K 71/00* | (2023.01) | |
| *H10K 59/12* | (2023.01) | |
| *H10K 102/00* | (2023.01) | |

(52) U.S. Cl.
CPC ......... *H10K 59/121* (2023.02); *H10K 59/128* (2023.02); *H10K 59/38* (2023.02); *H10K 59/88* (2023.02); *H10K 71/00* (2023.02); *H10K 59/1201* (2023.02); *H10K 2102/311* (2023.02)

(58) Field of Classification Search
CPC .................................................. H10K 59/121
See application file for complete search history.

(56) References Cited

U.S. PATENT DOCUMENTS

| | | |
|---|---|---|
| 4,769,292 A | 9/1988 | Tang |
| 5,247,190 A | 9/1993 | Friend |

(Continued)

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo et al. "Highly efficient phosphorescent emission from organic electroluminescent devices", Nature, vol. 395, pp. 151-154, 1998.
(Continued)

*Primary Examiner* — Douglas M Menz
(74) *Attorney, Agent, or Firm* — Butzel Long

(57) ABSTRACT

A transparent emissive device is provided. The device may include one or more OLEDs having an anode, a cathode, and an organic emissive layer disposed between the anode and the cathode. In some configurations, the OLEDs may be non-transparent. The device may also include one or more locally transparent regions, which, in combination with the non-transparent OLEDs, provides an overall device transparency of 5% or more.

7 Claims, 6 Drawing Sheets

Related U.S. Application Data 2, 2016, now Pat. No. 10,283,577, which is a division of application No. 13/656,188, filed on Oct. 19, 2012, now Pat. No. 9,385,172.

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 6,537,688 B2 | 3/2003 | Silvernail |
| 6,597,111 B2 | 7/2003 | Silvernail |
| 6,664,137 B2 | 12/2003 | Weaver |
| 6,664,173 B2 | 12/2003 | Doyle |
| 6,835,950 B2 | 12/2004 | Brown |
| 6,888,305 B2 | 5/2005 | Weaver |
| 6,888,307 B2 | 5/2005 | Silvernail |
| 6,897,474 B2 | 5/2005 | Brown |
| 7,187,119 B2 | 3/2007 | Weaver |
| 7,279,704 B2 | 10/2007 | Walters |
| 7,431,968 B1 | 10/2008 | Shtein |
| 7,683,534 B2 | 3/2010 | Weaver |
| 7,968,146 B2 | 6/2011 | Wagner |
| 11,532,683 B2 * | 12/2022 | Hack ..................... H10K 59/88 |
| 2003/0230980 A1 | 12/2003 | Forrest |
| 2004/0174116 A1 | 9/2004 | Lu |
| 2006/0097631 A1 | 5/2006 | Lee |
| 2007/0114522 A1 * | 5/2007 | Kwok .................. H10K 59/176 |
| | | 257/40 |
| 2012/0286651 A1 | 11/2012 | Levermore |
| 2013/0135328 A1 | 5/2013 | Rappoport |
| 2017/0229663 A1 | 8/2017 | Tsai |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Office Action dated Mar. 8, 2018 for U.S. Appl. No. 15/170,986 (pp. 1-10).

\* cited by examiner

ONE WAY TRANSPARENT DISPLAY

This application is a continuation of U.S. application Ser. No. 17/183,582, filed Feb. 24, 2021, which is a divisional of U.S. application Ser. No. 16/382,281, filed Apr. 12, 2019, which is a divisional of U.S. application Ser. No. 15/170,986, filed Jun. 2, 2016, which is a divisional of U.S. Application Ser. No. 13/656,188, filed Oct. 19, 2012, and is related to U.S. application Ser. No. 13/912,961, filed Jun. 7, 2013, which is a continuation-in-part of U.S. Application Ser. No. 13/656,188, filed Oct. 19, 2012, and is also related to U.S. application Ser. No. 14/049,468, filed Oct. 9, 2013, which is a continuation-in-part of U.S. Application Ser. No. 13/656,188, filed Oct. 19, 2012, the disclosure of each of which are incorporated by reference in their entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to OLEDs and, more specifically, to OLED devices that are transparent and emit light primarily or entirely through a single surface.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the following structure:

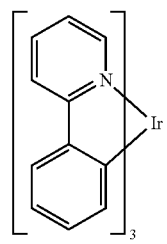

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

OLED devices and method of fabricating the same are provided. The devices include emissive regions and locally-transparent regions, such that the device has an overall transparency of at least 5%.

In an embodiment of the invention disclosed herein, a device may include a light emitting surface a first region and a second region, where the device transmits light through the first region and emits light from the second region, and has an overall device transparency of at least 5%, at least 10%, or more. The device may be, for example, a display such as a full-color display, an OLED display, an AMOLED display, a flexible OLED display, or the like. The second region may have a higher local transparency than the first region, for example where the local transparency of the region is less than 5%, less than 1%, or less. The device may include multiple OLEDs configured to emit light through the first surface, which may be arranged to emit light only or primarily through the first region of the light emitting surface. The OLEDs may occupy not more than about 75% of the total area of the display. At least 70% of the area of the display not occupied by the plurality of OLEDs may have a local transparency of at least 25%, 50%, or more. The device may be divided into regions, each of which includes at least one OLED and a transparent region having a local transparency of at least 25%. Overall, such transparent regions may occupy at least 25% of the total area of the light emitting surface. In some configurations the OLED devices may include a white emitting device and/or one or more color filters. The device may be flexible, and may be fabricated on, for example, a plastic substrate. It also may include additional layers, such as protective layers, including a single layer barrier encapsulation layer, which may be disposed over the light emitting surface or another surface of the device.

In an embodiment of the invention disclosed herein, an OLED device may include two electrodes having different surface areas, where the surface area of one is not more than about 80% of the surface area of the other, and an emissive layer disposed between the electrodes. The OLED device may be configured to emit light only through one electrode. Alternatively or in addition, multiple electrodes may be disposed on one side of the emissive layer, which have a combined surface area of not more than about 80% of the surface area of the other electrode. The device may have an overall transparency of at least 5%, 10%, or more. It may include an OLED, an AMOLED, a flexible OLED, one or more color filters or filter layers, a flexible substrate such as a plastic substrate, a protective layer such as a single layer barrier encapsulation, or the like.

In an embodiment of the invention, a method of fabricating a device as disclosed herein is provided. The method may include, for example, depositing an anode material over a substrate having a transparency of at least 5%, to form a patterned layer that covers a first portion of the substrate and does not cover a second portion of the substrate, depositing an emissive layer over the first portion and the second portion of the substrate, and depositing a cathode material over the first portion and the second portion of the substrate. Such a method also may use appropriate substrates, emissive layers, control components, and other components as disclosed herein. The resulting device may have an overall transparency of 5%, 10%, or more.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
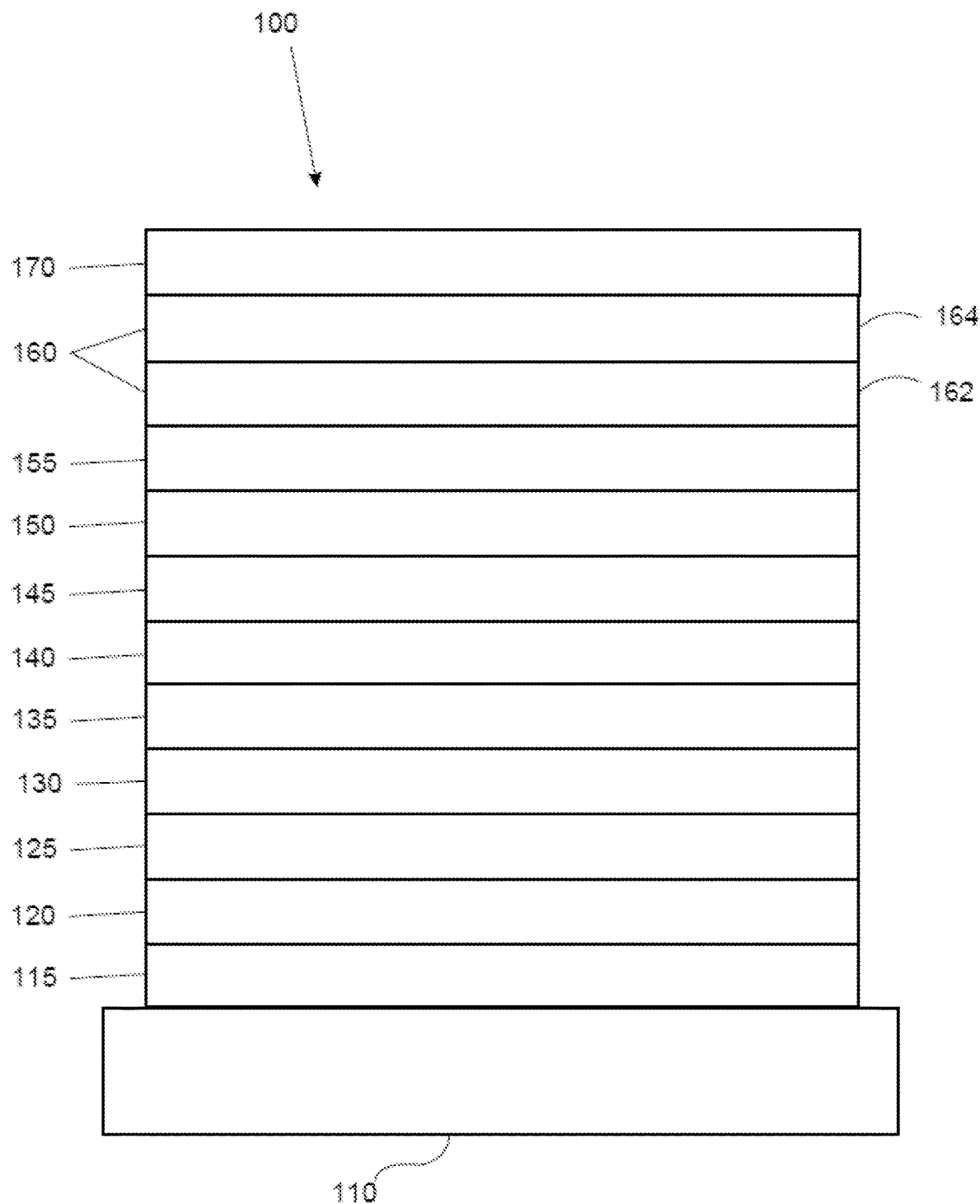
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
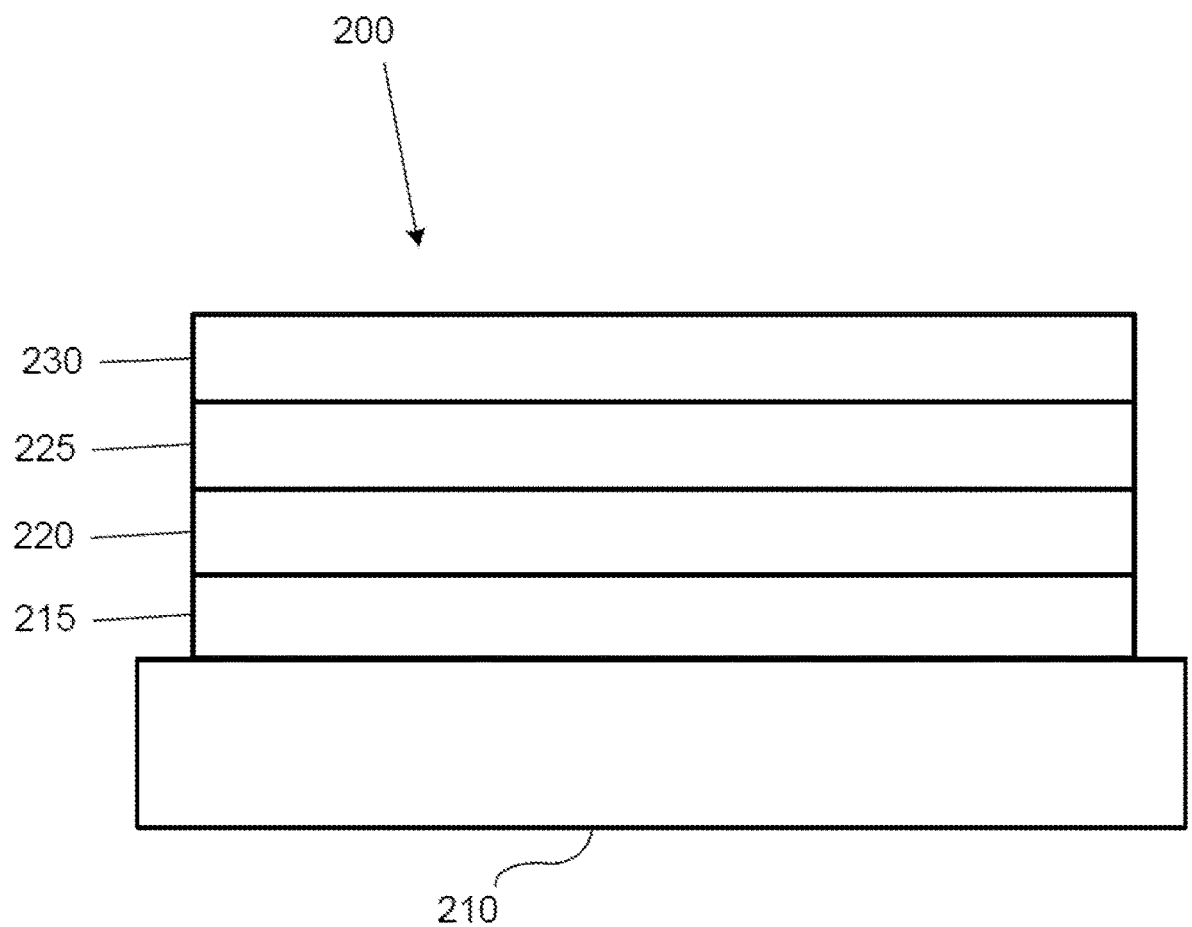
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos.

6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

In a conventional OLED display, it is common to try to maximize the fill factor or pixel aperture ratio, that is, the fraction of display surface or pixel-covered area that emits light. This typically may reduce the current density required to be applied to the active OLED devices to achieve a desired performance, and thus extend device lifetimes.

Transparent OLEDs (TOLEDs) have been demonstrated where the basic OLED device is effectively transparent, and which emit light through both the anode and cathode surfaces. Such devices typically may be constructed by using a transparent cathode combined with the commonly used transparent anode. Conventional TOLED displays also may use semi-transparent cathodes, which can be more difficult than metal cathodes to make in mass production as they may rely on a relatively high uniformity of thin films used during fabrication.

In some cases it may be desirable to use a TOLED that emits light in only one direction, while the overall display remains relatively transparent or partially transparent. Various TOLED arrangements have been demonstrated that emit only in one direction by using filters or polarized light and/or polarizers, for example on one surface of the device. Such devices also may be relatively complex and costly to construct, and may have a relatively low overall transparency and/or relatively high thickness.

In an embodiment of the invention, a transparent organic light emitting device is provided. The OLED device may include an anode, a cathode, and an organic emissive layer disposed between the anode and the cathode. The organic emissive layer may include a host and a phosphorescent dopant or any other combination of emissive and other materials as previously described herein. The device may also include one or more locally transparent regions, which allows the device to have an overall transparency of 5% or more.

Generally, a device as disclosed herein includes one or more emissive regions adjacent to one or more transparent regions. For example, for a full color display, the device may include red, green, and blue OLEDs, such as conventional bottom- or top-emission OLED devices, which are not conventional transparent OLED devices. The emissive OLED devices may be disposed adjacent to one or more regions that have a relatively high degree of transparency, and which may not contain a metallic non-transparent electrode. Devices disclosed herein also may be constructed to emit white light, or to emit monochrome or any other subset of color compared to a full-color display. Similarly, instead of using red, green, and blue emissive regions, devices as disclosed herein may use white emissive devices in conjunction with color filters to achieve visible light of a desired color. OLED devices as disclosed herein include emissive regions with electrodes that are opaque or essentially opaque and therefore prevent transmission through the device, and only emit light through one surface of the OLED devices. When these emissive devices are disposed adjacent to transparent regions that allow transmission through the device, the device may appear transparent when viewed by the human eye while only emitting light in a single direction. For example, a display may be transparent to visible light, while emitting light through a single surface of the display.

In some cases, OLEDs and similar devices may emit a relatively small amount of light in directions other than the primary emissive surface or surfaces, such as where a small amount of light may be emitted from the edges of the device. Such light typically may be blocked or masked by, for example, a housing or other component. As used herein, a device is considered to emit light through a single surface or in a single direction if 97%, more preferably 98%, and more preferably 99% of light emitted by the device is emitted through the single surface or in the single direction.

Devices as disclosed herein may be implemented using, for example, a typically metallic cathode deposited through a mask so as not to be disposed over the locally-transparent regions for a bottom-emissive device. As another example, for a top emission device, where the anode is usually reflective, the anode may be patterned so as not to block light through the locally-transparent region or regions. The emissive regions may be driven in any suitable conventional manner, such as using row and column drivers, whereas the locally-transparent region may not be electrically driven.

Figure 3:
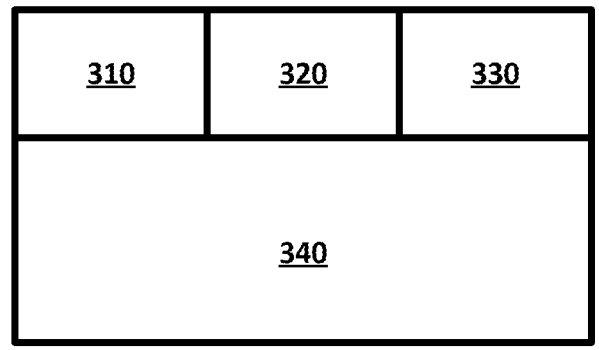
FIG. 3 shows a schematic top view of a region of an example device according to an embodiment of the invention.

FIG. 3 shows a schematic top view of a region of an example device according to an embodiment of the invention. The region shown may be, for example, a portion of a full-color display or other emissive device, such as a general purpose lighting device. The region includes one or more emissive regions 310, 320, 330, which may be red, green, and blue emissive elements, respectively. A second region 340 may be non-emissive but relatively transparent. More specifically, the emissive region or regions 310, 320, 330 may be more opaque than the transparent region 340, such that light is prevented from being transmitted through the device in the emissive regions, but may pass through the transparent region 340. The region and/or the device as a whole may have an overall transparency of at least 5%, at least 10%, or more. That is, at least 5% or more of the light that is incident on either side of the device may be transmitted through the device. The emissive regions 310, 320, 330 prevent light from being transmitted through the device, but emit light through one surface of the device. As used herein, a surface of a device through which light emitted by components of the device is emitted may be referred to as a "light emitting" surface, though the light may be generated by components other than the device such as OLEDs or other emissive components within the device. That is, a "light emitting" surface of a device may not itself be emissive, but may allow light generated within the device to be transmitted through the device to a region external to the device.

The emissive regions 310, 320, 330 may be OLEDs, including AMOLEDs, as described herein. Each region may include a separate OLED, such as where each region is configured to emit a different color of light. Preferably, each OLED is configured to emit light primarily, essentially entirely, or entirely through a single surface of the device. For example, where the device is a full-color flat panel display, the OLEDs may emit light only through the display surface, and not emit light through the back surface of the device. In some configurations, a relatively small amount of light may be emitted through the sides of the device, i.e., parallel to the plane of the device.

By adjusting the relative areas of the device that include emissive regions and transparent regions and the transparency of each transparent region, a desired overall transparency may be achieved. For example, a transparent region may have a local transparency of at least 25%, 50%, or more. As used herein, a "local transparency" refers to the transparency of only the transparent region considered alone, without regard to the transparency of any other region of the device or the device as a whole. Thus, a region having a local transparency of 25% allows about 25% of incident light to be transmitted through the device, though when considered as a whole the device may allow about 5% or 10% of incident light to be transmitted through the device. The transparency of a device or a region may be determined by measuring the luminosity of visible light incident on the device and the resulting luminosity of light transmitted through the device or region. Since the emissive regions are opaque, a greater area of the device that includes emissive regions leads to a lower overall transparency for the device. In an embodiment, it may be preferred for the emissive regions to extend over not more than about 75% of the total area of the device. This may be higher than conventional displays due to the area usually required by other parts of the pixel that may not be transparent, such as bus lines, TFTs, and the like. Thus, it also may be useful to determine the area that includes emissive regions relative to the area available for emissive regions such as OLEDs in the device, when other components are excluded. In an embodiment, it may be preferred for the emissive regions to occupy at least about 20% of the area available for emissive components in a device such as a display.

Such a configuration allows for an overall transparency of the region or device of at least 5%. Similarly, the greater the area of the transparent region, the greater the overall transparency of the device or region. In an embodiment, it may be preferred for the area not occupied by the emissive region or regions to have a local transparency of at least 25%, 50%, or more. In some configurations, portions of the device that do not include emissive regions also may not be transparent, or may be less transparent than the transparent regions. For example, the device may include a housing, structural supports, circuitry, or other layers or components that are less transparent that the layers and materials in the transparent regions. In an embodiment, at least 70%, 80%, 90%, or more of the area not occupied by an emissive region may have a local transparency of 25%, 50%, or more. Alternatively or in addition, it may be preferred for transparent regions in the device to occupy at least 10% of the total area of the device.

Although described with respect to FIG. 3 as using individual OLEDs of different colors, the configurations disclosed herein also may be used to realize to white-emitting devices that may or may not include a color filter layer disposed over each emissive region or OLED. For example, each of the emissive regions 310, 320, 330 in FIG. 3 may be a white-emitting device, or fewer larger devices may be used. One or more color filters may be disposed between the white-emitting devices and the emissive surface of the device to allow for a colored or full-color display.

As previously described, a variety of substrates and other layers may be used with any embodiment of the invention. For example, a plastic and/or flexible substrate may be used. Flexible and plastic substrates are disclosed herein, and are also described in further detail in U.S. Pat. No. 6,664,173, the disclosure of which is incorporated by reference in its entirety. Similarly, a single layer barrier as disclosed herein may be used as an encapsulation layer of the device.

Figure 4A:
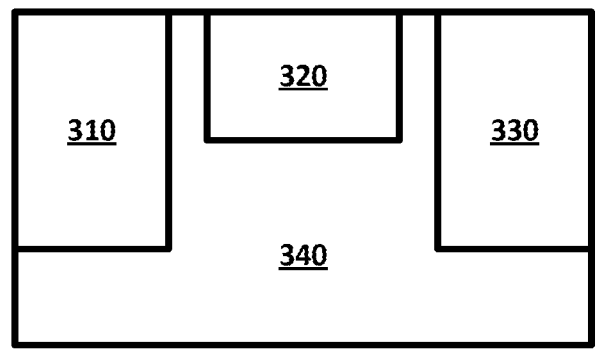
FIG. 4A shows an example arrangement of emissive and transparent regions according to an embodiment of the invention, in which the emissive regions have non-equal areas the transparent region is contiguous.
Figure 4B:
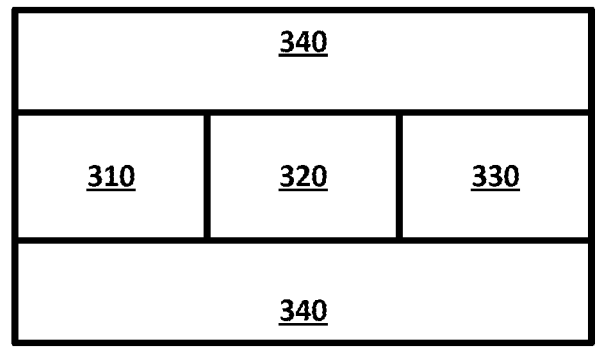
FIG. 4B shows an example arrangement of emissive and transparent regions according to an embodiment of the invention, in which the transparent region is non-contiguous.
Figure 4C:
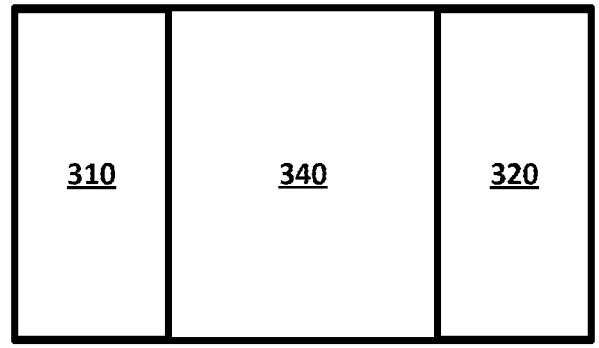
FIG. 4C shows an example arrangement of emissive and transparent regions according to an embodiment of the invention that includes two emissive regions separated by a transparent region.
Figure 4D:
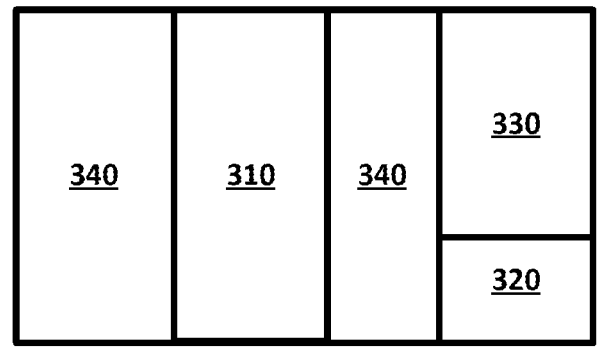
FIG. 4D shows an example arrangement of emissive and transparent regions according to an embodiment of the invention that includes a non-contiguous transparent region and emissive regions with non-equal areas.

FIG. 3 shows an example arrangement of emissive regions and a transparent region. FIGS. 4A-4D show additional examples of such arrangements in accordance with the invention. Notably, a device according to the invention, or a region of such a device, need not have a single contiguous transparent region. Further, the emissive regions need not be immediately adjacent to one another, and need not have equal areas. FIG. 4A shows an example arrangement in which the emissive regions 310, 320, 330 have non-equal areas and in which the transparent region 340 is contiguous. FIG. 4B shows an example arrangement in which the transparent region 340 is non-contiguous. FIG. 4C shows an example arrangement that includes two emissive regions 310, 320 separated by a transparent region 340. FIG. 4D shows an example arrangement with a non-contiguous transparent region and emissive regions 310, 320, 330 with non-equal areas. As is understood in the art, arrangements such as those shown in FIGS. 4A-4D may be used, for example, to adjust the relative emission of differently-colored OLED devices, such as to achieve an overall improved lifetime.

Figure 5:
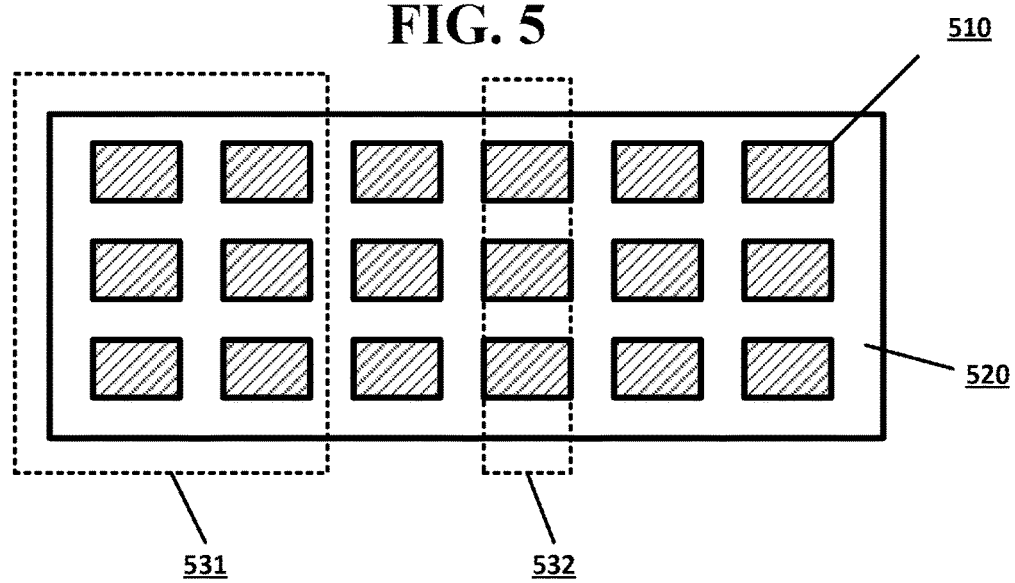
FIG. 5 shows an example device according to an embodiment of the invention that includes multiple emissive regions and a transparent region that surrounds the emissive regions.

FIGS. 3 and 4A-4D show example regions of a device. As will be readily understood by one of skill in the art, these arrangements may be extended to a larger-scale device, such as a general illumination panel, a limited- or full-color display, or the like. FIG. 5 shows an example device having multiple emissive regions 510 and a transparent region 520 that surrounds the emissive regions 510. It will be apparent that, by selecting various regions of the larger region shown in FIG. 5, arrangement such as those described with respect to FIGS. 3 and 4A-4D may be identified. For example, the region 531 includes six emissive regions surrounded by a contiguous transparent region. Similarly, the region 532 includes three emissive regions a non-contiguous transparent region.

Figure 6:
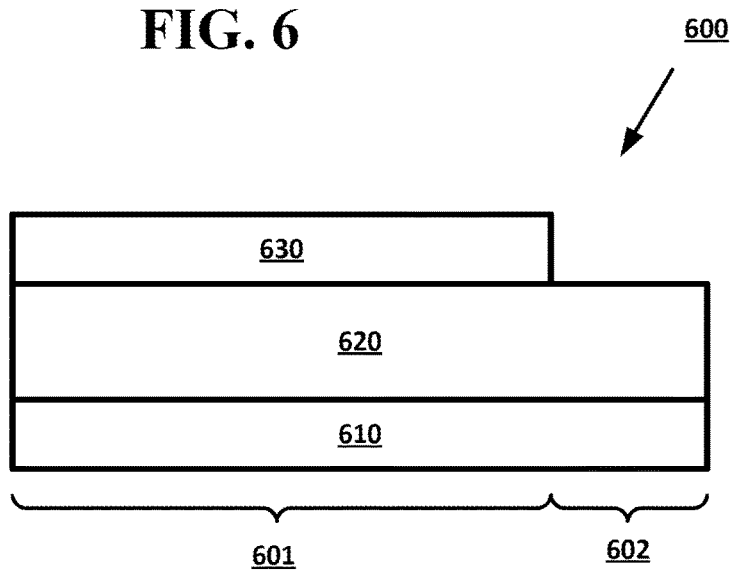
FIG. 6 shows an example of a device according to an embodiment of the invention that includes two electrodes, where one has a surface area less than the surface area of the other.

The emissive regions described with respect to FIGS. 3-5 may comprise one or more OLEDs having various arrangements, and may be fabricated in a variety of ways. In an embodiment, each emissive region may include an OLED, such as an AMOLED. FIG. 6 shows an example of such an OLED 600. The device includes an electrode 610, an emissive layer 620, and an electrode 630 with a surface area less than the surface area of the electrode 610. It may be preferred for the electrode 630 to have a surface area that is not more than about 80% the surface area of the electrode 610. Although FIG. 6 shows an example device having only an emissive layer for ease of illustration, it will be understood that the device may include any of the other layers conventionally used in an OLED, such as the layers described with respect to FIGS. 1 and 2. Further, the device may include additional emissive layers, and may emit a combination of colors or white light. As previously described, the device also may include color filters to allow operation as a white and colored or full-color device. It also may include a single-layer barrier as an encapsulation layer, as well as other suitable coverings, layers, components, and the like.

In operation, the device 600 may emit light from the region of the emissive layer 620 that is disposed between the electrodes 610 and 630. The emissive layer 620, the electrode 610, and other layers disposed between the electrodes 610, 630 may be transparent, preferably at least 25% transparent, while the electrode 630 may be completely or relatively opaque. For example, the electrode 630 may be less than 5% transparent. Thus, an arrangement such as shown in FIG. 6 may provide both an emissive region 601 and a transparent region 602, which may correspond to an emissive region and a transparent region as described with respect to FIGS. 3-5, respectively. In configurations in which electrode 630 is fully opaque, light may be emitted only through the bottom electrode 610 because the emissive OLED will only be formed in the region defined by the overlap of the two electrodes 610 and 630.

Figure 7:
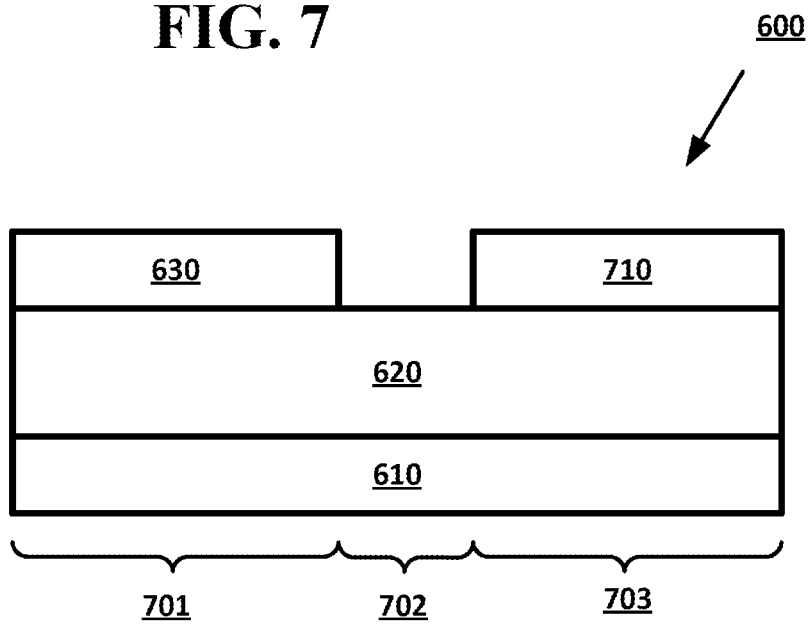
FIG. 7 shows an example of a device according to an embodiment of the invention that includes multiple electrodes, where the combined electrode surface area on one side of the device is less than the surface area of a single electrode on the other side of the device.

FIG. 7 shows a configuration similar to the configuration shown in FIG. 6, that includes multiple electrodes 630, 710 that have a combined surface area less than that of the electrode 610. Such a configuration provides multiple emissive regions 701, 703 and a transparent region 702. The electrodes 630, 710 may be deposited and patterned using any of the patterning techniques disclosed herein.

Figure 8:
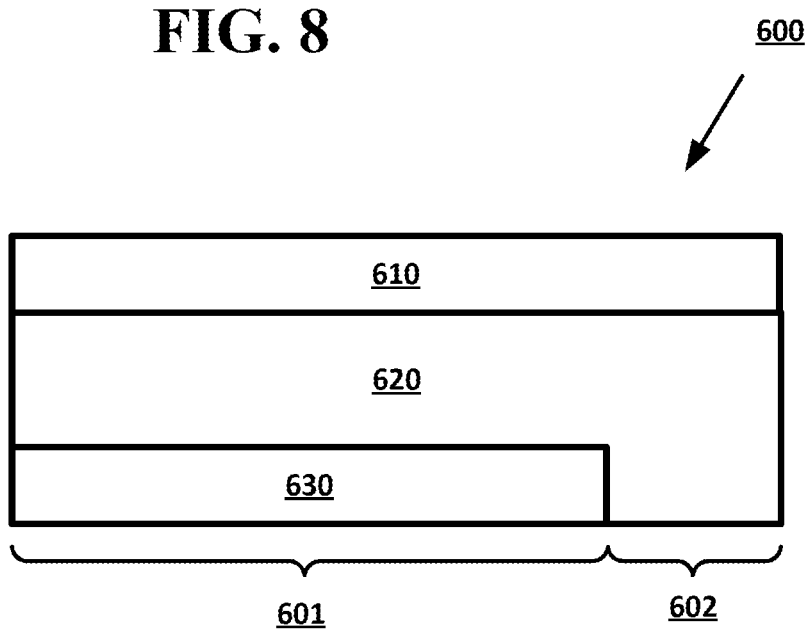
FIG. 8 shows an example device according to an embodiment of the invention in which an emissive layer is disposed over a non-transparent electrode.

FIG. 8 shows an example configuration in which the emissive layer 620 is disposed over the non-transparent electrode 630. As previously described, such a configuration may provide an emissive region 601 and a transparent region 602.

The OLED device arrangements shown in FIGS. 6-8 may be top-emitting or bottom-emitting devices. That is, they may be configured to emit light through only the electrode 610, such as in configurations where the electrode 630 is opaque. As previously described, the device 600 may have an overall transparency of at least 5%, at least 10%, or more, since it includes both a transparent region and one or more non-transparent devices. The layers shown in FIGS. 6-8 may be disposed over any suitable substrate, such as flexible substrates, plastic substrates, and the like, as previously described.

Other configurations may be used to achieve a device having both emissive regions or devices and transparent regions as described. For example, each emissive region may be an individual OLED that is physically separated from some or all of adjacent OLEDs. The OLEDs may be disposed on or within additional transparent layers, such as a substrate, an encapsulation layer, an active or passive backplane, and the like. The additional layers may be at least 5% transparent, thus providing the transparent regions previously described in those regions that do not include an OLED.

Devices as disclosed herein may be fabricated in a variety of ways. For example, referring to FIGS. 6 and 7, the electrode 610, emissive layer 620, and other layers in the device may be deposited using any of the appropriate techniques disclosed herein. The electrode 630 and 710 (if present) may then be deposited over the electrode 610, emissive layer 620, and any other intervening layers, using a mask or other patterning deposition technique. Similarly, referring to FIG. 8, an electrode material, such as an anode material, may be deposited on a substrate to form the electrode 630, such that the deposited material covers only a portion of the substrate. The emissive layer 620, electrode 610, and other intervening layers may be deposited over the same portion of the substrate, as well as at least a portion of the substrate over which the electrode material 630 is not deposited. As previously described, the electrode 610, emissive layer 620, and other layers may be at least 5% transparent or more, thus allowing the region of the completed device that is not disposed over the electrode 630 to be at least 5% transparent.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:
1. A device comprising:
   a first plurality of top-emitting organic light emitting diodes (OLEDs) that are disposed over a transparent substrate; and
   a second plurality of bottom-emitting OLEDs that are disposed over the transparent substrate,
   wherein the device has an overall transparency of at least 5%.

2. The device of claim 1, wherein one or more of the first plurality of top-emitting OLEDs and the second plurality of bottom-emitting OLEDs includes a phosphorescent dopant.

3. The device of claim 1, wherein one or more of the first plurality of top-emitting OLEDs and the second plurality of bottom-emitting OLEDs is phosphorescent.

4. The device of claim 1, wherein at least one of the first plurality of top-emitting OLEDs is disposed at least partially over at least one of the second plurality of bottom-emitting OLEDs.

5. The device of claim 1, wherein at least one of the first plurality of top-emitting OLEDs and the second plurality of bottom-emitting OLEDs are configured to emit light through a first region of the transparent substrate.

6. The device of claim 1, further comprising:
   at least one additional layer selected from the group consisting of: a color filter, a single-layer barrier as an encapsulation layer, an active backplane, and a passive backplane disposed on or under at least one of the first plurality of top-emitting OLEDs and the second plurality of bottom-emitting OLEDs.

7. The device of claim 1, wherein the device has an overall transparency of at least 10%.

* * * * *